(12) United States Patent
Kim et al.

(10) Patent No.: US 6,772,246 B2
(45) Date of Patent: Aug. 3, 2004

(54) PCI RISER CARD BRACKET ASSEMBLY

(75) Inventors: David K. J. Kim, San Jose, CA (US); William W. Ruckman, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 178 days.

(21) Appl. No.: 09/911,296

(22) Filed: Jul. 23, 2001

(65) Prior Publication Data

US 2003/0016496 A1 Jan. 23, 2003

(51) Int. Cl.[7] .............................................. G06F 13/14
(52) U.S. Cl. ..................... 710/62; 439/630; 439/637; 361/753; 361/801; 361/802
(58) Field of Search ........................ 710/62; 439/630, 439/637; 361/753, 802, 801

(56) References Cited

U.S. PATENT DOCUMENTS

| | | | |
|---|---|---|---|
| 3,853,379 A | | 12/1974 | Goodman et al. |
| 5,642,264 A | * | 6/1997 | Cantrell ........................ 361/802 |
| 5,751,551 A | * | 5/1998 | Hileman et al. ............ 361/753 |
| 5,848,906 A | | 12/1998 | Glusker et al. |
| 5,909,359 A | | 6/1999 | Summers et al. |
| 5,961,352 A | * | 10/1999 | Denny et al. ................ 439/637 |
| 6,030,230 A | | 2/2000 | Peacock |
| 6,056,601 A | * | 5/2000 | Pollock et al. .............. 439/630 |
| 6,356,457 B1 | * | 3/2002 | Haworth ...................... 361/801 |

* cited by examiner

Primary Examiner—A. Elamin
(74) Attorney, Agent, or Firm—Meyertons Hood Kivlin Kowert & Goetzel, P.C.; B. Noël Kivlin

(57) ABSTRACT

The present invention discloses methods and apparatus for installing printed circuit boards within an electronic assembly. One embodiment is a riser card bracket assembly for an electronic system. The riser card bracket comprises an adjustable card retainer disposed within the riser card bracket assembly; the retainer is capable of movement within the riser card bracket assembly to secure cards of various lengths. Another embodiment of the invention is a method for installing cards within a computer housing having a motherboard. The method comprises providing a riser card bracket assembly having an adjustable card retainer. At least one card is inserted within the riser card bracket assembly. The riser card bracket assembly is inserted within the computer housing whereby the at least one card is positioned parallel to the motherboard. A portion of the riser card bracket assembly is inserted into a connector located on the motherboard, thereby creating electrical connection between the card and the motherboard.

27 Claims, 5 Drawing Sheets

PCI RISER CARD BRACKET ASSEMBLY

BACKGROUND OF THE INVENTION

1. Field of the Invention

This invention relates generally to the placement of components within an electrical assembly, and, more particularly, to the placement and support of peripheral component interface (PCI) bus cards within a computer system.

2. Description of Related Art

Computer systems are general-purpose devices that may be modified to perform particular tasks or functions. Generally, computer systems include a motherboard, a power source and other components mounted within a cabinet. The motherboard typically includes a number of connectors or slots in which special purpose printed circuit boards, often referred to as peripheral component interface (PCI) bus cards or "cards", may be inserted. These special purpose cards may be used to add to or enhance the functionality of the computer system. For example, a conventional computer system may have its graphics capability enhanced by the addition of a graphics card. Similarly, the sound-producing capability of the computer system may be enhanced by the addition of a sound card. The inserted card typically extends perpendicular from the motherboard.

One limitation on the ability to add to or enhance the functionality of the computer system is the size constraints of the computer system housing. In particular, the height constraints placed on the system can dictate whether any cards can be directly attached to the motherboard and if so, the physical dimensions of the card. For example, if the height of the card is greater than the height limitation of the computer system housing, there will not be enough room to physically fit the card within the housing. In cases like this, it can be desirable to locate the cards parallel to the motherboard, such as in a stacked configuration, rather than in the typical perpendicular alignment.

While minimizing the effects of the height restriction, locating the cards parallel to the motherboard can create problems for physically connecting the components of the computer system to one another. Since the cards are not directly connected to the motherboard, additional connectors are required and problems with alignment and support for the cards can become issues. For example if the cards, additional connectors and motherboard are not physically aligned correctly, a connection between the components may be difficult. If a connection can be physically accomplished, forces acting on the components, due to any misalignment or movement of the computer system, may result in mechanical failure of one or more of the components, either immediately or at some future time. Such stress forces imposed on the components can cause traces to crack and fail, solder joints to become loosened, and board-level devices to fail.

There is a need for improved methods and apparatus to enable the placement, support and connection of cards parallel to the motherboard within a computer assembly.

SUMMARY OF THE INVENTION

One embodiment of the present invention is a riser card bracket assembly for an electronic system. The riser card bracket comprises an adjustable printed circuit board retainer disposed within the riser card bracket assembly, the retainer is capable of movement within the riser card bracket assembly to secure printed circuit boards of various lengths.

Another embodiment of the invention is a method for installing cards within a computer housing having a motherboard. The method comprises providing a riser card bracket assembly having an adjustable card retainer. At least one card is inserted within the riser card bracket assembly. The riser card bracket assembly is inserted within the computer housing whereby the at least one card is positioned parallel to the motherboard A portion of the riser card bracket assembly is inserted into a connector located on the motherboard, thereby creating electrical connection between the card and the motherboard.

BRIEF DESCRIPTION OF THE DRAWINGS

The invention may be understood by reference to the following description, taken in conjunction with the accompanying drawings, in which.

Figure 1:
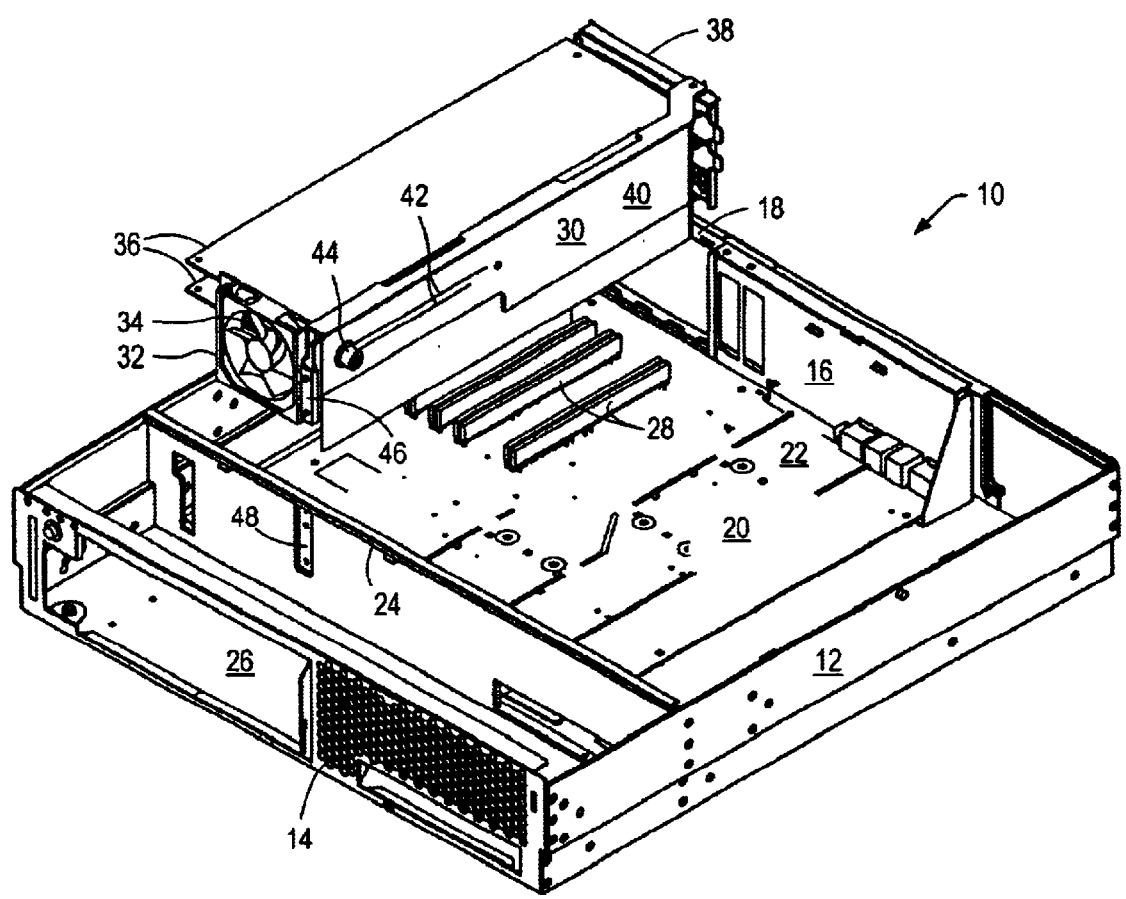
FIG. 1 shows a partially exploded top perspective view of the interior of an electronic assembly comprising an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DESCRIPTION OF ILLUSTRATIVE EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to the attached drawings, FIG. 1 is a partially exploded perspective view of a computer assembly 10 comprising a chassis 12 with a front enclosure 14 and a rear enclosure 16. Within this application the term "computer assembly" can be used to refer to electronic assemblies, electronic devices and other multi-component systems in which the present invention can be used. The rear enclosure 16 has a rear panel window 18 that enables access to components within the chassis 12. A motherboard 20 is disposed within the chassis 12 and defines a motherboard compartment 22. A middle frame element 24 separates the motherboard compartment 22 from a removable device compartment 26. Connected to the motherboard 20 are conventional PCI-type edge connectors 28.

Within the motherboard compartment 22 is a peripheral component interface (PCI) bus riser assembly 30. At a front end of the PCI riser assembly 30 is a cooling fan housing 32 and a cooling fan 34 that provides a forced airflow within the PCI riser assembly 30 to aid the dissipation of heat. Two printed circuit boards, such as conventional PCI cards 36 are shown disposed within and attached to the PCI riser assembly 30. At the rear end of the PCI riser assembly 30 is a PCI input/output (I/O) window bracket 38. A riser card stiffener 40 provides support for the PCI riser assembly 30. The riser card stiffener 40 comprises an adjusting slot 42 and an adjustable slide assembly 44. An alignment bracket 46 is attached to the front end of the riser card stiffener 40, the alignment bracket 46 being adapted to mate with an alignment notch 48 within the middle frame element 24.

Figure 2:
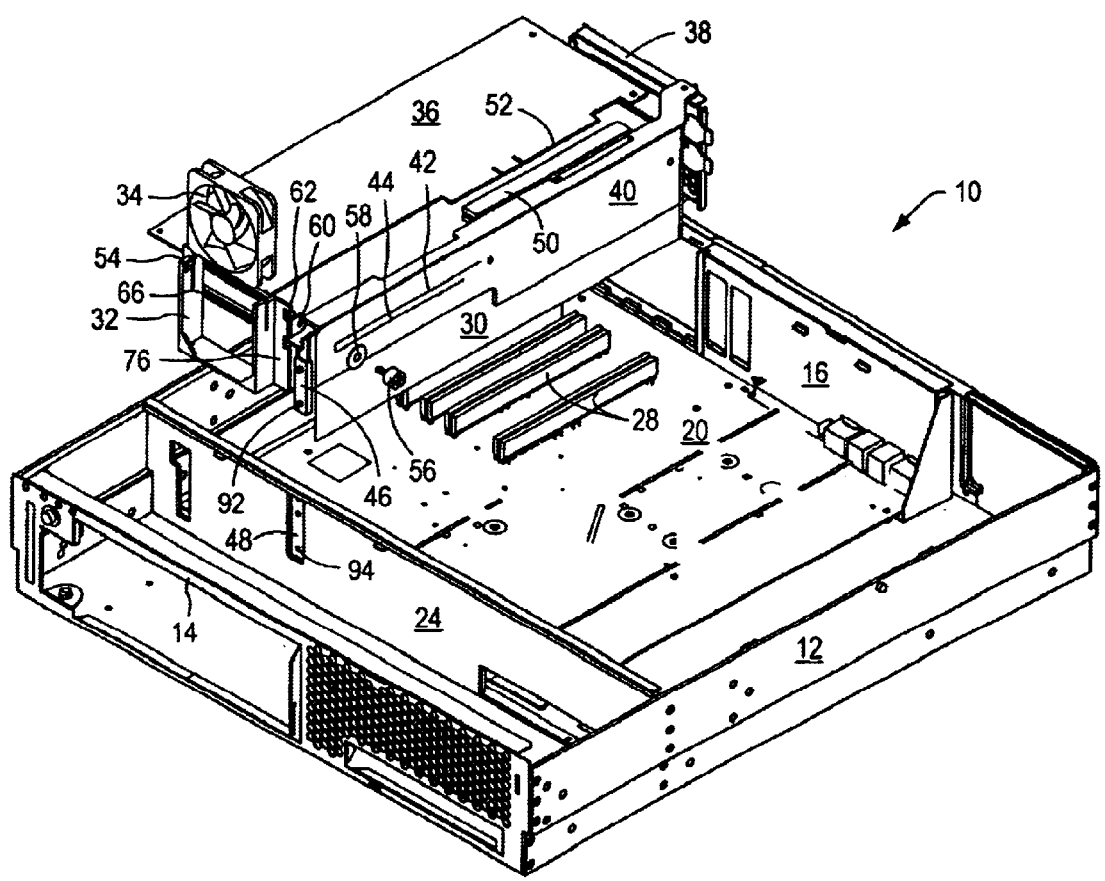
FIG. 2 shows a partially exploded top perspective view of the interior of an electronic assembly comprising an embodiment of the present invention.

FIG. 2 is a partially exploded view of the computer assembly 10 that shows a conventional PCI-type edge connector 50 that is part of the PCI riser assembly 30. The PCI card 36 is positioned parallel to the motherboard 20, and a conventional connector 52 on the PCI card 36 is inserted into the PCI-type edge connector 50. The PCI riser assembly 30 provides electrical connections between the PCI card 36 and the motherboard 20 through the PCI-type edge connectors 50, 28.

The fan housing 32 comprises a retaining element 54 that releasably engages with the fan 34, enabling tool-free installation and removal of the fan 34 from the fan housing 32. Also attached to the fan housing 32 are card support members 66 that support the PCI cards 36 by engaging with an edge of the PCI card 36. Two notches 76 in the fan housing 32 are designed to engage with guide rails that are connected to the inside wall of the PCI riser assembly 30 and are used to attach and align the fan housing 32 with the PCI riser assembly 30.

The adjustable slide assembly 44 comprises a thumbscrew 56, a washer 58, a tab 60 extending from the fan housing 32, and a nut 62. The threaded portion of the thumbscrew 56 is inserted through the washer 58, the adjusting slot 42, and the tab 60 and is threadably engaged to the nut 62. The washer 58 can comprise a lock washer that acts to retain the adjustable slide assembly 44 in a secure position when the thumbscrew 56 is tightened upon the nut 62. The nut 62 is capable of being attached to the fan housing 32 or in other ways secured so as not to be able to turn, thus enabling the adjustable slide assembly 44 to be tightened or loosened by turning only the thumbscrew 56. The adjustable slide assembly 44 can provide tool-free adjustment and securing of the fan housing 32 along the length of the adjusting slot 42. The term thumbscrew, within this application, is used to refer to a fastening element that is capable of being operated by hand without the use of a tool and/or operated with the use of a tool.

The phrase "tool-free installation and removal" means that the connectors or retaining elements can be engaged and disengaged without the use of a tool, for example, a screwdriver or a wrench. The human hand of a person of ordinary dexterity can perform the installation and removal. Examples of connectors and retaining elements that can provide tool-free installation and removal include flexible snaps and tabs and spring loaded retaining rings.

Figure 3:
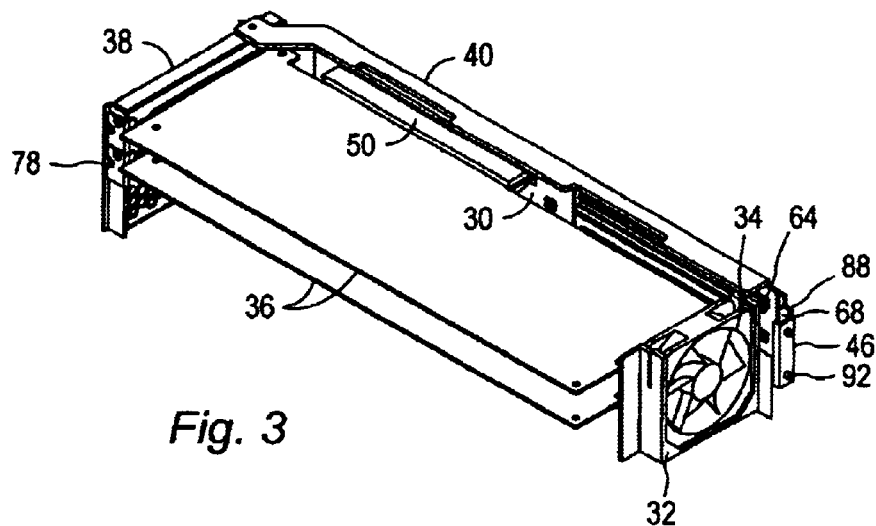
FIG. 3 shows a perspective view of the top and side of a PCI riser assembly in one embodiment of the present invention.

FIG. 3 is a perspective view of the inside of the PCI riser assembly 30 comprising two conventional PCI-type cards 36 attached to the conventional PCI-type edge connectors 50. Two guide rails 64 are connected to the inside wall of the PCI riser assembly 30. The guide rails 64 guide and align the fan housing 32 in relation to the riser card stiffener 40. The alignment bracket 46 is shown engaged onto a projection 68 from the riser card stiffener 40.

Figure 4:
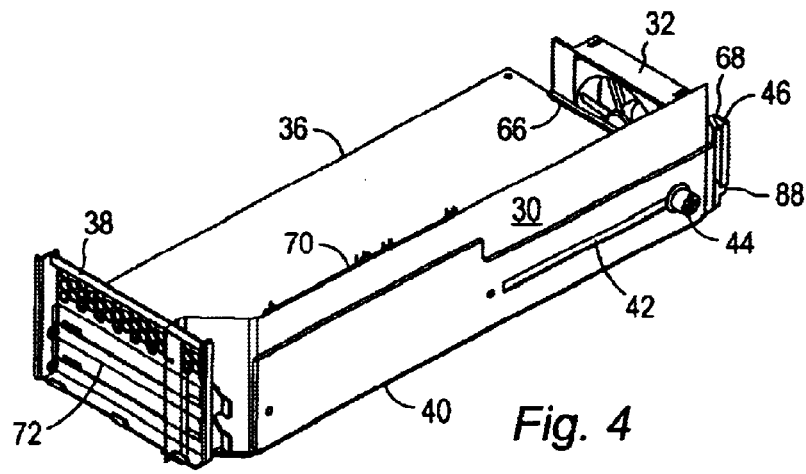
FIG. 4 shows a perspective view of the bottom and side of a PCI riser assembly in one embodiment of the present invention.

FIG. 4 shows a perspective side view of the PCI riser assembly 30 and shows a PCI riser connector 70. The PCI riser connector 70 is inserted into the conventional PCI-type edge connector 28 located on the motherboard 20 when the PCI riser assembly 30 is installed in the computer assembly 10. The PCI I/O window bracket 38 comprises individual access ports 72 to provide support for the PCI cards 36 and allow external devices, such as phone lines, to be connected to the individual PCI cards 36. Card support members 66 are attached to the fan housing 32 and support and stabilize the PCI cards 36. The adjustable slide assembly 44 allows the fan housing 32 and card support members 66 to adjust along the length of the adjusting slot 42 to conform to PCI cards 36 of various lengths.

Figure 5:
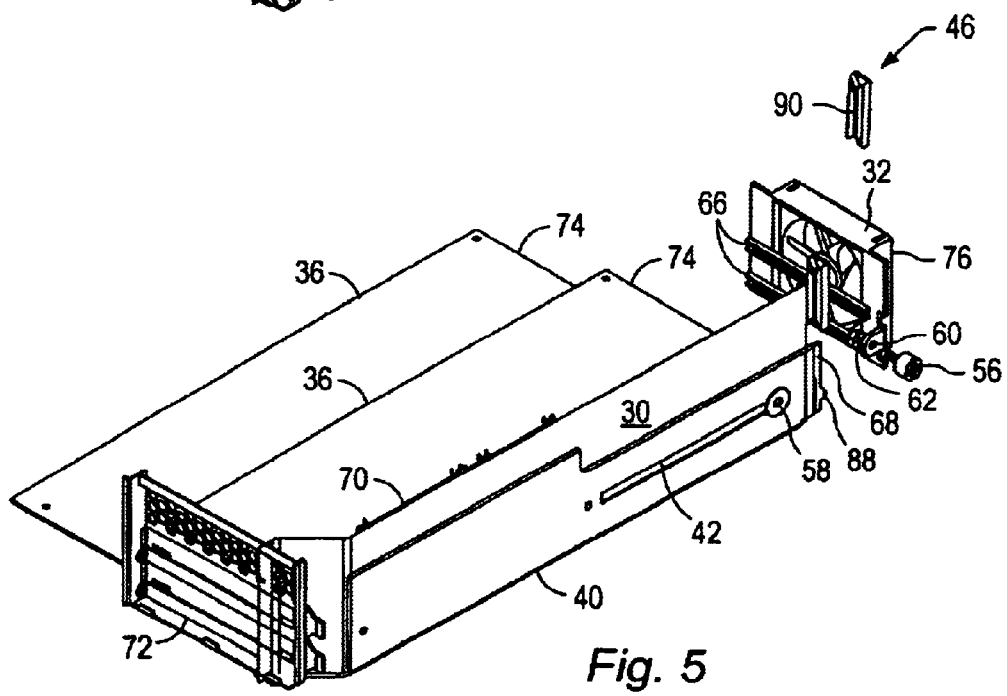
FIG. 5 shows a partially exploded view of the bottom and side of a PCI riser assembly in one embodiment of the present invention.

FIG. 5 provides a partially exploded view of the PCI riser assembly 30 of FIG. 4. An end portion 74 of the PCI cards 36 fits within the card support members 66 that are connected to the fan housing 32. Generally, the card support members 66 have a U-shaped cross sectional configuration such that they may slidingly receive the end portions 74 of the PCI cards 36. The U-shaped cross section has an internal dimension greater that the thickness of the PCI cards 36 to substantially restrain the is card 36 against vertical movement while still allowing limited movement to permit mating alignment with the PCI connectors 28, 50.

The alignment bracket 46 is shown in relation to the projection 68 from the riser card stiffener 40 with which it engages. The alignment bracket 46 comprises a groove 90 that the projection 68 slides into until a stop 88 on the projection 68 restricts further movement. Referring also to FIG. 2, the alignment bracket 46 can be attached to the alignment notch 48 within the middle frame element 24 prior to insertion of the PCI riser assembly 30 within the computer assembly 10. In the embodiment shown in FIG. 2, the front side of the alignment bracket 46 comprises projections 92 that can engage with recesses 94 within the alignment notch 48, thus securing the alignment bracket 46 within the computer assembly 10 until the PCI riser assembly 30 is inserted. The projections 92 can comprise screws that engage with the recesses 94 that can comprise tapped holes. The projections 92 can also comprise rivets, snaps, clips or other connecting means that are known to those of ordinary skill in the art. When the PCI riser assembly 30 is inserted into the computer assembly 10, the projection 68 on the riser card stiffener 40 can be aligned with and slid into the groove 90 located on the back side of the alignment bracket 46, thereby securing the PCI riser assembly 30 to the middle frame element 24. The stop 88 can also enter the groove 90 and serve as a press-fit connection joining the riser card stiffener 40 with the middle frame element 24. The press-fit connection between the stop 88 and the alignment bracket 46 provides increased stability to the computer assembly 10 and restricts the PCI riser card assembly 30 from backing out of engagement with the middle frame element 24 when external forces such as shock or vibration are imposed.

Figure 6:
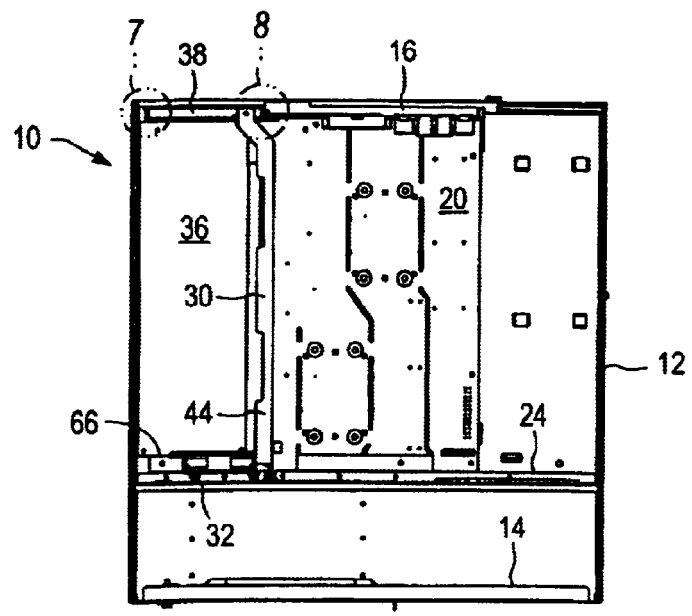
FIG. 6 shows a top view of an embodiment of the present invention.

FIG. 6 is a top view of the computer assembly 10 showing an embodiment of the PCI riser assembly 30 in relation to the motherboard 20 and the middle frame element 24. The fan housing 32 and card support members 66 are attached to the PCI riser assembly 30 by the adjustable slide assembly 44, and are adjustable along the length of the PCI riser assembly 30. The fan housing 32 and card support members 66 are shown attached to and supporting the end of a PCI card 36. The PCI I/O window bracket 38 provides access to the PCI card 36 through the rear enclosure 16 for connection with external devices.

Figure 7:
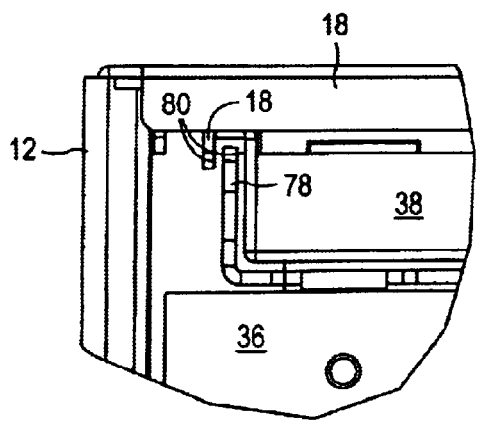
FIG. 7 shows the alignment of an embodiment of the present invention within the computer housing.

FIG. 7 is an enlarged top view of a portion of the embodiment shown in FIG. 6 that shows the alignment of the PCI card 36, the PCI I/O window bracket 38 and the rear panel window 18. A PCI I/O window left guide 78 is shown disposed within a rear panel window 18 left guide 80. The rear panel window 18 left guide 80 provides sufficient tolerance to enable slight movement of the PCI I/O window bracket 38 and the PCI riser assembly 30 for alignment and connection of the PCI riser connector 70 with the PCI-type edge connector 28 on the motherboard 20.

Figure 8:
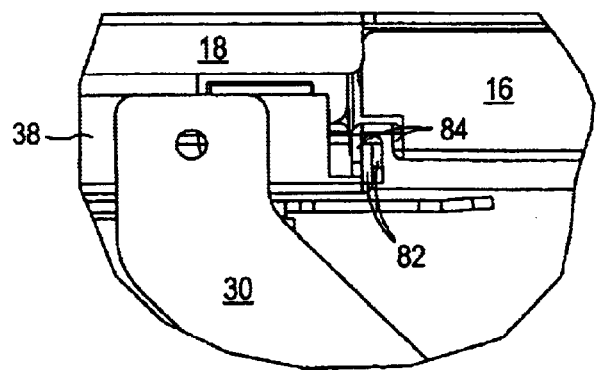
FIG. 8 shows the alignment of an embodiment of the present invention within the computer housing.

FIG. 8 is an enlarged top view of a portion of an embodiment shown in FIG. 6 that shows the alignment of the PCI riser assembly 30, the PCI I/O window bracket 38 and the rear panel window 18. A PCI I/O window right guide 82 is shown within the rear panel window 18 right guide 84. The rear panel window 18 right guide 84 provides sufficient tolerance to enable slight movement of the PCI I/O window bracket 38 and the PCI riser assembly 30 for alignment and connection of the PCI riser connector 70 with the PCI-type edge connector 28 on the motherboard 20.

Figure 9:
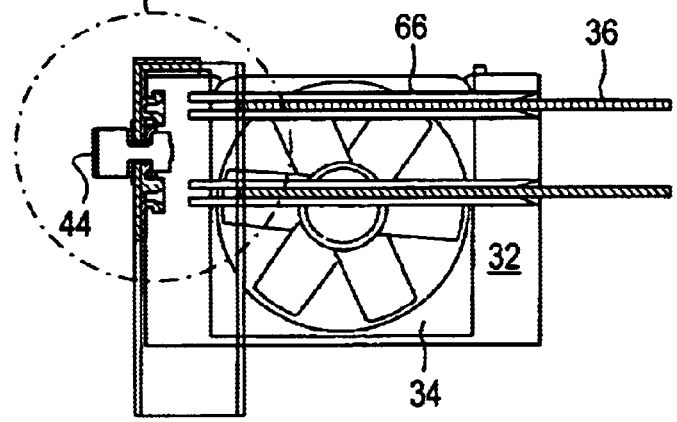
FIG. 9 is a sectional view of an embodiment of the present invention from the interior of the card riser assembly.

FIG. 9 is a sectional view from inside the PCI riser assembly 30 looking towards the fan 34. The fan 34 is disposed within the fan housing 32. Attached to the fan housing 32 are the card support members 66 that are shown holding PCI cards 36. The adjustable slide assembly 44 is shown connected to the fan housing 32.

Figure 10:
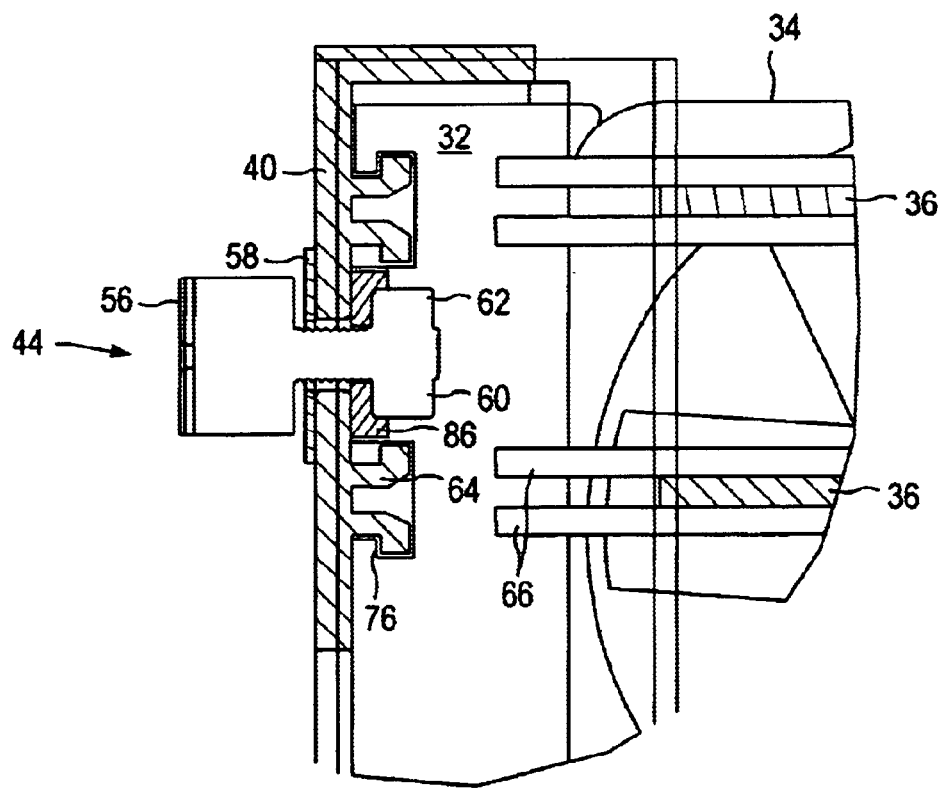
FIG. 10 is an expanded view of a portion the embodiment shown in FIG. 9.

FIG. 10 is an expanded view of the adjustable slide assembly 44 shown in FIG. 9. The notches 76 in the fan housing 32 are engaged with the guide rails 64 that protrude from the riser card stiffener 40. The thumbscrew 56 is shown inserted through the washer 58, riser card stiffener 40, and the tab 60 that extends from the fan housing 32. A nut 62 is threadably connected to the thumbscrew 56. The tab 60 is shown to have a recess 86 having a profile that mates with the nut 60 profile, whereby when the nut 60 is in the recess 86, the nut 60 is restrained from turning. In this way the thumbscrew 56 can be loosened from the nut 60, the adjustable slide assembly 44 moved, and the thumbscrew 56 tightened again, without needing to position a tool within the assembly 44 to restrict the nut 60 from turning.

Referring now to FIGS. 2–8, to install a PCI card into the PCI riser assembly 30, loosen the adjustable slide assembly 44 from the riser card stiffener 40 by turning the thumbscrew 56. Slide the fan housing 32 and card support members 66 toward the fan end of the PCI riser assembly 30. Insert the PCI card 36 into the PCI riser assembly 30 and press the connector 52 of the card 36 into the PCI connector 50, thus making electrical contact between the card 36 and the PCI riser assembly 30. Slide the fan housing 32 and card support members 66 toward the PCI card 36 until the edge of the card 36 is inserted into the card support member 66. The thumbscrew 56 of the adjustable slide assembly 44 can now be tightened to secure the fan housing 32 and the card 36 to the riser card stiffener 40.

To install the PCI riser assembly 30 into the computer assembly 10, engage the alignment bracket 46 with the alignment notch 48 by inserting the alignment bracket 46 projections 92 into the alignment notch 48 recesses 94, thus securing the alignment bracket 46 to the middle frame element 24. Align the PCI I/O window left guide 78 with the rear panel window 18 left guide 80, align the PCI I/O window right guide 82 with the rear panel window 18 right guide 84, and align the projection 68 on the riser card stiffener 40 with the groove 90 on the alignment bracket 46. Having both ends of the PCI riser assembly 30 properly aligned, the PCI riser assembly 30 can be inserted into the chassis 12. The PCI I/O window left guide 78 engages with the rear panel window 18 left guide 80, the PCI I/O window right guide 82 engages with the rear panel window 18 right guide 84, and the projection 68 on the riser card stiffener 40 engages with the groove 90 on the alignment bracket 46. The PCI riser assembly 30 connection prongs 70 can then be plugged into a connector 28 on the motherboard 20 until the PCI riser assembly 30 is firmly seated, thus making electrical connection between the motherboard 20, PCI riser assembly 30 and the PCI card 36. The stop 88 on the projection 68 can also be inserted into the groove 90 on the alignment bracket 46, thereby forming a press-fit connection that restricts further movement of the PCI riser assembly 30 in relation to the middle frame element 24.

It should be appreciated that while the embodiments described herein make specific reference to PCI cards and riser assemblies, those skilled in the art will recognize that the present invention has wide application. For example, the present invention may be employed in concert with other bus configurations, such as Industry Standard Architecture (ISA), Accelerated Graphics Port (AGP), or the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of installing cards within a computer housing having a motherboard, the method comprising:

providing a riser card bracket assembly having a riser card, a stiffener coupled to the riser card, and a slidable mechanism coupled to the stiffener;

inserting at least one printed circuit board into a first connector, wherein the first connector is located on the riser card;

inserting the riser card bracket assembly within the computer housing whereby the at least one printed circuit board is positioned parallel to the motherboard; and inserting a portion of the riser card bracket assembly into a second connector, wherein the second connector is located on the motherboard, thereby creating an electrical connection between the printed circuit board and the motherboard.

2. The method of claim 1, further comprising:
moving the slidable mechanism to attach to and secure an edge of the card; and
securing the slidable mechanism to the riser card bracket assembly by tightening a retaining element.

3. The method of claim 1, further comprising:
aligning guides on the riser card bracket assembly with guides on the computer housing.

4. A method of installing and cooling printed circuit boards within a computer housing comprising:
providing a riser card bracket assembly having a riser card, a stiffener coupled to the riser card, and a slidable mechanism coupled to the stiffener, wherein the slidable mechanism includes an integral fan housing;
inserting a printed circuit board into a first connector, the first connector located on the riser cards, such that the printed circuit board is in a horizontal position;
adjusting the slidable mechanism to secure an edge of the printed circuit board;
securing the riser card assembly to a second connector, wherein the second connector is located on a motherboard located within the computer housing, thereby electrically connecting the printed circuit board to the motherboard;
inserting a fan within the fan housing;
energizing the fan to create a forced airflow; and
cooling the printed circuit board by passing the forced airflow over the printed circuit board.

5. A riser card bracket assembly for an electronic system, the assembly comprising:
a riser card, wherein the riser card is configured to be coupled to an expansion slot of the electronic system, wherein the riser card includes one or more connectors each configured to receive an edge connector of one of one or more peripheral cards of variable lengths, and wherein the riser card is configured to provide an electrical connection between each of the one or more peripheral cards and the electronic system;
a stiffener coupled to the riser card; and
a slidable mechanism coupled to the stiffener, wherein the stiffener includes a slot for adjusting the slidable mechanism, and wherein the slidable mechanism is adjustable to support each of the one or more peripheral cards of variable lengths.

6. The assembly as recited in claim 5, wherein the slidable mechanism includes a fan housing, the fan housing configured to house a cooling fan.

7. The assembly as recited in claim 5, wherein the slidable mechanism includes one or more card support members, wherein each of the one or more card support members is configured to provide support to one of the one or more peripheral cards.

8. The assembly as recited in claim 5, further comprising a thumbscrew configured to engage the slidable mechanism through the slot of the stiffener.

9. The assembly as recited in claim 5, wherein the fan housing is configured to enable insertion and removal of a fan within the fan housing without using a tool.

10. The assembly as recited in claim 5, wherein the assembly is capable of being attached to or released from the electronic system without the use of a tool.

11. The assembly as recited in claim 5, wherein the slidable mechanism is capable of engaging or disengaging the one or more printed circuit boards without the use of a tool.

12. The assembly as recited in claim 5, wherein the expansion slot and the one or more connectors comprise PCI (peripheral component interface) connectors.

13. An electronic assembly comprising:
a motherboard; and
a riser card bracket assembly coupled to the motherboard, wherein the riser card bracket assembly includes:
a riser card, wherein the riser card is configured to be coupled to an expansion slot of the motherboard, wherein the riser card includes one or more connectors each configured to receive an edge connector of one of one or more peripheral cards of variable lengths, and wherein the riser card is configured to provide an electrical connection between each of the one or more peripheral cards and the motherboard;
a stiffener coupled to the riser card; and
a slidable mechanism coupled to the stiffener, wherein the stiffener includes a slot for adjusting the slidable mechanism, and wherein the slidable mechanism is adjustable to support each of the one or more peripheral cards of variable lengths.

14. The electronic assembly as recited in claim 13, wherein the slidable mechanism includes a fan housing, the fan housing configured to house a cooling fan.

15. The electronic assembly as recited in claim 13, wherein the slidable mechanism includes one or more card support members, wherein each of the one or more card support members is configured to provide support to one of the one or more peripheral cards.

16. The electronic assembly as recited in claim 13, further comprising a thumbscrew configured to engage the slidable mechanism through the slot of the stiffener.

17. The electronic assembly as recited in claim 13, wherein the fan housing is configured to enable insertion and removal of a fan within the fan housing without using a tool.

18. The assembly as recited in claim 13, wherein the assembly is capable of being attached to or released from the electronic system without the use of a tool.

19. The assembly as recited in claim 13, wherein the slidable mechanism is capable of engaging or disengaging the one or more printed circuit boards without the use of a tool.

20. The assembly as recited in claim 13, wherein the expansion slot and the one or more connectors are PCI (peripheral component interface) connectors.

21. The assembly as recited in claim 13, wherein the riser card, when coupled to the expansion slot, is oriented perpendicular to the motherboard.

22. The assembly as recited in claim 13, wherein each of the one or more peripheral cards, when coupled to the riser card, is oriented perpendicular to the riser card.

23. A riser card bracket assembly for an electronic system, the assembly comprising:
a riser card, wherein the riser card is configured to be coupled to an expansion slot of the electronic system, wherein the riser card includes one or more connectors each configured to receive an edge connector of one of one or more peripheral cards of variable lengths, and wherein the riser card is configured to provide an electrical connection between each of the one or more peripheral cards and the electronic system; and
a card support mechanism slidably engageable in relation to the riser card, wherein the card support mechanism is adjustable to support each of the one or more peripheral cards of variable lengths.

24. The riser card bracket assembly as recited in claim 23, wherein the riser card includes a slot, and wherein the card support mechanism is slidably engaged along the slot.

25. The riser card bracket assembly as recited in claim 23, wherein the card support mechanism includes a respective card support for supporting an end of each of the one or more peripheral cards.

26. The riser card bracket assembly as recited in claim 23, wherein the riser card, when coupled to the expansion slot, is oriented perpendicular to a motherboard of the electronic system upon which the expansion slot is mounted.

27. The riser card bracket assembly as recited in claim 23, wherein each of the one or more peripheral cards, when coupled to a respective one of the one or more connectors of the riser card, is oriented perpendicular to the riser card.

* * * * *